US006605865B2

(12) United States Patent
Jeong et al.

(10) Patent No.: US 6,605,865 B2
(45) Date of Patent: Aug. 12, 2003

(54) SEMICONDUCTOR PACKAGE WITH OPTIMIZED LEADFRAME BONDING STRENGTH

(75) Inventors: Jung Ho Jeong, Seoul (KR); Jong Chul Hong, Kyunggi-do (KR); Eun Deok Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/998,844

(22) Filed: Oct. 19, 2001

(65) Prior Publication Data
US 2002/0130400 A1 Sep. 19, 2002

(30) Foreign Application Priority Data

Mar. 19, 2001 (KR) ........................................ 2001-14140
Apr. 6, 2001 (KR) ........................................ 2001-18336

(51) Int. Cl.[7] ............................................. H01L 23/495
(52) U.S. Cl. ..................... 257/670; 257/666; 257/675; 257/676
(58) Field of Search ............................. 257/666, 670, 257/675, 676

(56) References Cited

U.S. PATENT DOCUMENTS

| 3,838,984 | A | 10/1974 | Crane et al. |
| 4,054,238 | A | 10/1977 | Lloyd et al. |
| 4,530,152 | A | 7/1985 | Roche et al. |
| 4,707,724 | A | 11/1987 | Suzuki et al. |
| 4,756,080 | A | 7/1988 | Thorp, Jr. et al. |
| 4,812,896 | A | 3/1989 | Rothgery et al. |
| 5,041,902 | A | 8/1991 | McShane |
| 5,157,480 | A | 10/1992 | McShane et al. |
| 5,172,213 | A | 12/1992 | Zimmerman |
| 5,172,214 | A | 12/1992 | Casto |
| 5,200,362 | A | 4/1993 | Lin et al. |

(List continued on next page.)

FOREIGN PATENT DOCUMENTS

| DE | 19734794 A1 | 8/1997 |
| EP | 0794572 A2 | 10/1997 |
| JP | 5745959 | 3/1982 |
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| KR | 941979 | 1/1994 |
| KR | 9772358 | 11/1997 |

Primary Examiner—Nathan J. Flynn
Assistant Examiner—Leonardo Andujar
(74) Attorney, Agent, or Firm—Stetina Brunda Garred & Brucker

(57) ABSTRACT

A semiconductor package including a sealing part which is bonded to a lead frame. The lead frame is formed to include portions of reduced thickness for purposes of providing maximum crack prevention during a singulation process involved in the manufacture of the semiconductor package. Additionally, the lead frame and the sealing part are sized and configured relative to each other so as to maximize the contact area therebetween, thus having the effect of improving the bonding strength between the lead frame and the sealing part. This increased contact area between the sealing part and the lead frame also maximizes the lengths of those passages susceptible to moisture permeation, thus minimizing such moisture permeation potential.

16 Claims, 14 Drawing Sheets

U.S. PATENT DOCUMENTS

| | | |
|---|---|---|
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,332,864 A | 7/1994 | Liang et al. |
| 5,336,931 A | 8/1994 | Juskey et al. |
| 5,343,076 A | 8/1994 | Katayama et al. |
| 5,406,124 A | 4/1995 | Morita et al. |
| 5,424,576 A | 6/1995 | Djennas et al. |
| 5,435,057 A | 7/1995 | Bindra et al. |
| 5,474,958 A | 12/1995 | Djennas et al. |
| 5,521,429 A | 5/1996 | Aono et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,776,798 A | 7/1998 | Quan et al. |
| 5,783,861 A | 7/1998 | Son |
| 5,835,988 A | 11/1998 | Ishii |
| 5,859,471 A | 1/1999 | Kuraishi et al. |
| 5,866,939 A | 2/1999 | Shin et al. |
| 5,877,043 A | 3/1999 | Alcoe et al. |
| 5,894,108 A | 4/1999 | Mostafazadeh et al. |
| 5,977,613 A | 11/1999 | Takata et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,025,640 A | 2/2000 | Yagi et al. |
| 6,072,228 A | 6/2000 | Hinkle et al. |
| 6,130,115 A | 10/2000 | Okumura et al. |
| 6,130,473 A | 10/2000 | Mostafazadeh et al. |
| 6,140,154 A | 10/2000 | Hinkle et al. |
| 6,143,981 A | 11/2000 | Glenn |
| 6,198,171 B1 | 3/2001 | Huang et al. |
| 6,225,146 B1 | 5/2001 | Yamaguchi et al. |
| 6,229,200 B1 | 5/2001 | Mclellan et al. |
| 6,242,281 B1 | 6/2001 | Mclellan et al. |
| 6,281,568 B1 | 8/2001 | Glenn et al. |
| 6,294,100 B1 | 9/2001 | Fan et al. |

SEMICONDUCTOR PACKAGE WITH OPTIMIZED LEADFRAME BONDING STRENGTH

CROSS-REFERENCE TO RELATED APPLICATIONS

The present application claims priority to Korean Patent Application Nos. 2001-14140 filed Mar. 19, 2001 and 2001-18336 filed Apr. 6, 2001.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which is sized and configured to, among other things, optimize the bonding strength between the lead frame and the remainder of the package, prevent moisture permeation into the package, and minimize cracking of the package during the process of manufacturing the same.

2. Description of the Related Art

The current trend in the electronics industry is to provide electronic appliances which are multi-functional, compact, and capable of achieving high performance levels. In view of this trend, a requirement has arisen that the semiconductor packages which are used in such electronic appliances be made in a "chip size". These chip-size packages are often referred to as a chip scale package or CSP. These chip-sized small semiconductor packages are usable in portable products such as cellular phones and PDA's which require high levels of reliability, electrical efficiency, and a small or compact size of minimal weight.

One type of currently manufactured CSP is a very small semiconductor package including a lead frame. This particular type of semiconductor package is constructed in a manner wherein a plurality of input/output signal lands (e.g. from four to one hundred signal lands) are formed at the edge of the bottom surface of the package. This configuration is in contrast to conventional lead frame packages which include, as an alternative to these signal lands, leads which project outwardly from the package and are formed by various trimming/forming techniques. In addition to including the signal lands formed at the periphery of the bottom surface thereof, these semiconductor packages also include a chip mounting pad, the bottom surface of which is exposed for purposes of maximizing an emission rate of heat generated by a semiconductor chip mounted thereto.

Though the above-described semiconductor packages provide the small size required by the electronic appliances discussed above, they possess certain deficiencies which detract from their overall utility. One such deficiency is the susceptibility of the semiconductor package to cracking during the process of manufacturing the same, and the further susceptibility of the semiconductor package to moisture permeation to the internal semiconductor chip. The susceptibility to moisture permeation is largely attributable to the minimal contact area between the lead frame and the remainder of the semiconductor package. This minimal contact area also gives rise to problems attributable to insufficient bonding strength between the lead frame and the remainder of the semiconductor package. The lack of adequate bonding strength makes the semiconductor package vulnerable to failure attributable to the creation of electrical discontinuities between the lead frame and the semiconductor chip and/or the dislodging of one or more of the signal lands of the lead frame from the remainder of the semiconductor package.

BRIEF SUMMARY OF THE INVENTION

In accordance with the present invention, there is provided a semiconductor package including a lead frame and an encapsulation portion or sealing part which is formed on a prescribed region of the lead frame. The lead frame of the present semiconductor package is formed to have a thin profile so as to minimize occurrences of the cracking of the semiconductor package during the process of manufacturing the same, which typically involves the completion of a singulation process or step. Additionally, in the present semiconductor package, the contact area between the sealing part and the lead frame is maximized to improve the bonding strength between the lead frame and the sealing part. This improved bond strength substantially eliminates occurrences of delamination between the sealing part and the lead frame, such as the inadvertent dislodging of the signal lands of the lead frame from the sealing part. Further, the lead frame and the sealing part are sized and configured relative to each other such that the increased contact area between them also increases the lengths of those passages which would be susceptible to moisture permeation to the semiconductor chip of the semiconductor package. This structural attribute substantially prevents occurrences of moisture permeation as could adversely affect the performance of the semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the accompanying drawings wherein.

Common reference numerals are used throughout the drawings and detailed description to indicate like elements.

DETAILED DESCRIPTION OF THE INVENTION

Figure 1:
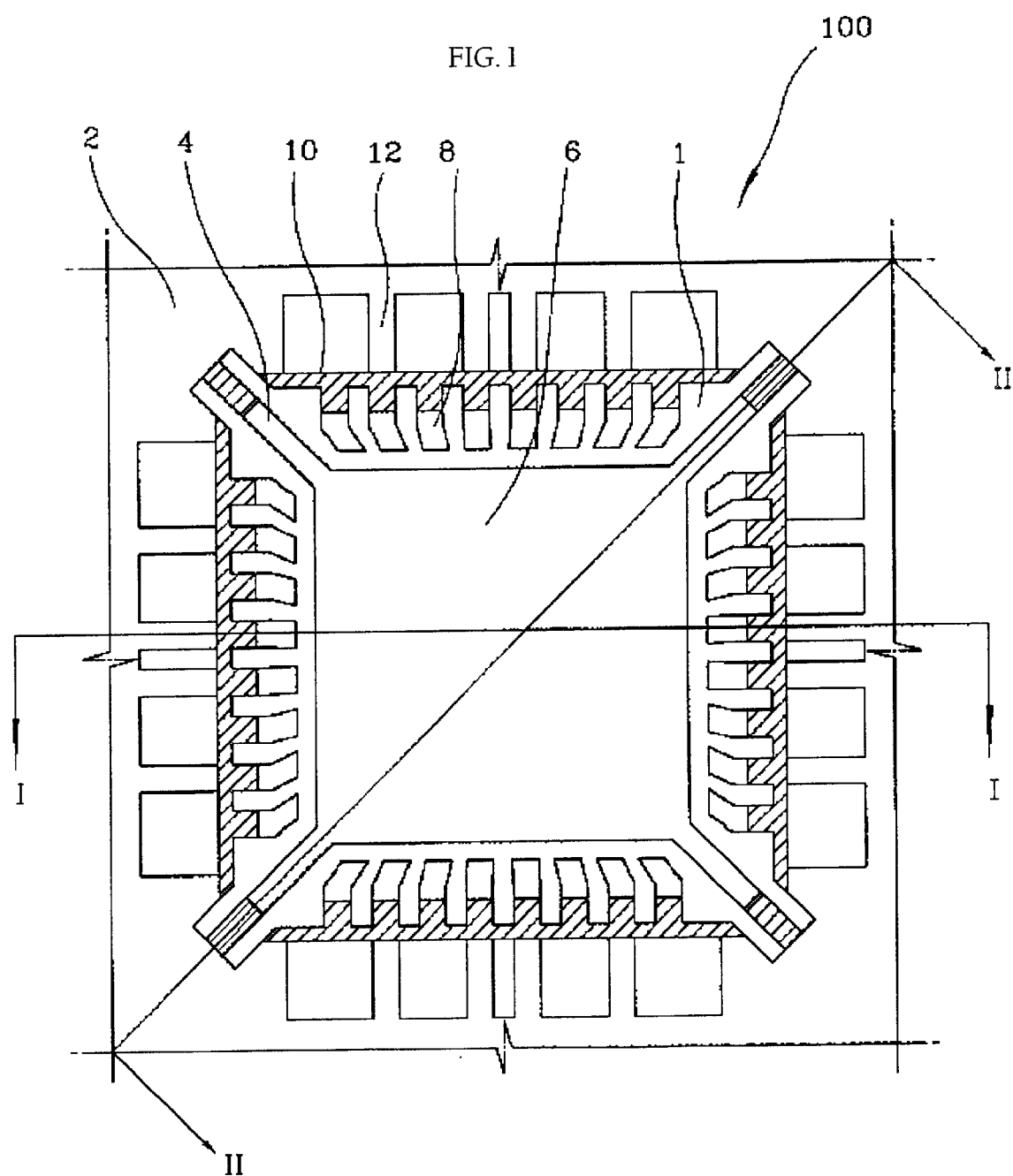
FIG. 1 is a top plan view of the lead frame of a semiconductor package constructed in accordance with a first embodiment of the present invention prior to the singulation thereof from a metal strip.
Figure 2:
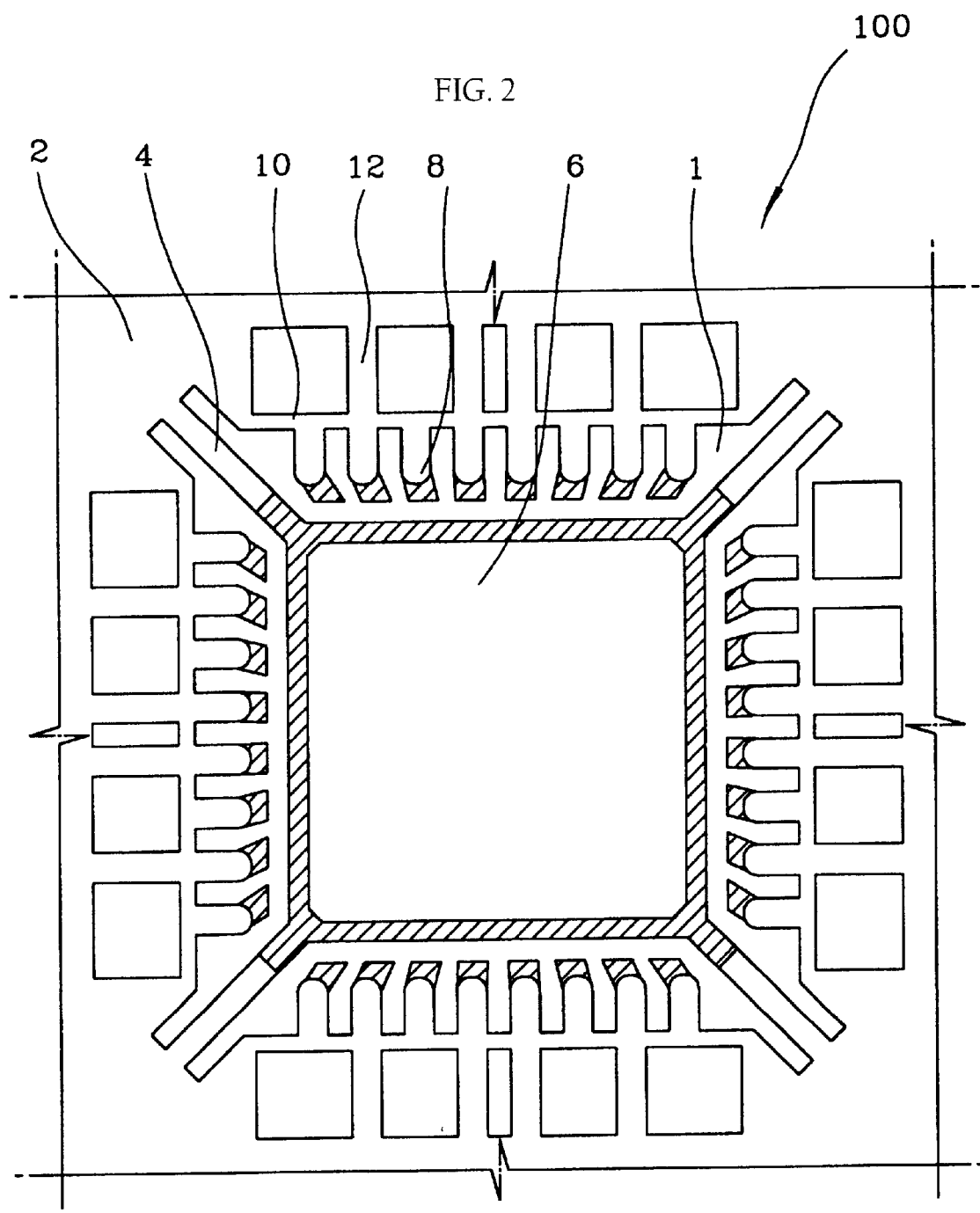
FIG. 2 is a bottom plan view of the lead frame shown in FIG. 1.

Referring now to the drawings wherein the showings are for purposes of illustrating preferred embodiments of the present invention only, and not for purposes of limiting the same, FIGS. 1 and 2 depict top and bottom plan views, respectively, of a lead frame 100 for use in a semiconductor package 200 constructed in accordance with a first embodiment of the present invention. Lead frames for semiconductor packages are typically manufactured by mechanically stamping or chemically etching a continuous metal strip. The lead frame serves as a lead connecting a semiconductor chip to an external circuit such as a motherboard. The lead frame further serves as a frame for fixing the semiconductor package to the motherboard while providing an electrical connection between the motherboard and the semiconductor chip.

The lead frame 100 of the present invention comprises a frame 2 which is a substantially flat or planar plate defining a centrally located space 1. Disposed within the space 1 is a chip mounting pad or pad 6 of the lead frame 100. The chip mounting pad 6 is a substantially square plate which is connected to the frame 2 by a plurality of tie bars 4. As seen in FIGS. 1 and 2, four (4) tie bars 4 are used to connect the chip mounting pad 6 to the frame 2, with the tie bars 4 extending from respective ones of the four corner regions defined by the chip mounting pad 6. The tie bars 4 facilitate the stable support of the chip mounting pad 6 inside of the frame 2, and more particularly within the space 1 defined thereby.

The lead frame 100 further comprises a multiplicity of leads 8 which protrude from the frame 2 into the space 1 toward the peripheral edge of the chip mounting pad 6. As shown in FIGS. 1 and 2, a total of thirty-two leads 8 are included in the lead frame 100, with the leads 8 being segregated into four sets of eight, and each set of eight being disposed in spaced relation to a respective one of the four peripheral edge segments defined by the chip mounting pad 6. Each of the leads 8 is connected to and extends perpendicularly from a dambar 10, the opposed ends of which are connected to the frame 2. A total of four dambars 10 are included in the lead frame 100, with each set of eight leads 8 extending from a respective dambar 10. Each dambar 10 is further connected to the distal ends of a plurality of supporting leads 12, with the opposed ends of the supporting leads 12 themselves being connected to the frame 2. Thus, the leads 8 are supported in a stable manner in the space 1 defined by the frame 2 by the dambars 10 and the corresponding supporting leads 12. As indicated above, the free, distal ends of the leads 8 are disposed in spaced relation to the peripheral edge of the chip mounting pad 6.

Those of ordinary skill in the art will recognize that the position and path of the leads 8 may be varied, and that the leads 8 can be suitably designed according to the number and position of input/output paths desired in the semiconductor package 200. Additionally, though the lead frame 100 shown in FIGS. 1 and 2 has a square configuration, it may alternatively be rectangularly configured. Similarly, though the chip mounting pad 6 is shown in FIGS. 1 and 2 as being generally square, the same may also be provided in a generally rectangular configuration. Further, though the leads 8 are shown as being formed in four separate sets around the entire periphery of the chip mounting pad 6, the leads 8 may also be provided in only two sets extending along and in spaced relation to respective ones of only two of the peripheral edge segments of the chip mounting pad 6. Still further, the chip mounting pad 6 may be connected to the frame 2 through the use of only two tie bars 4 as opposed to the four tie bars 4 shown in FIGS. 1 and 2. The leads 8 may also be formed directly on the frame 2 without necessarily forming the dambars 10 and supporting leads 12. Moreover, one or more of the leads 8 can be directly connected to the chip mounting pad 6 to eliminate the need for the tie bars 4 altogether.

Figure 3:
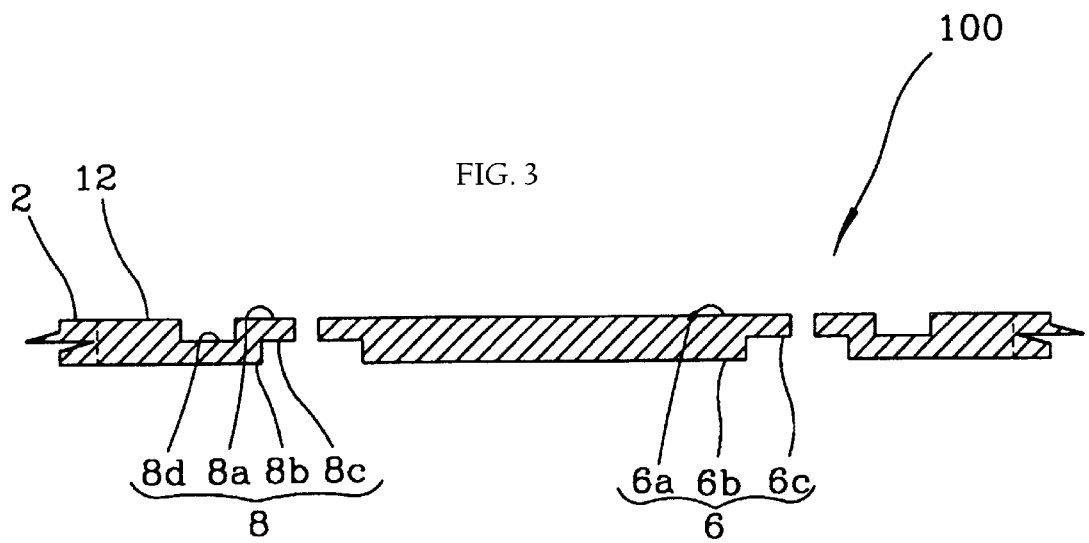
FIG. 3 is a cross-sectional view taken along line I—I of FIG. 1.
Figure 4:
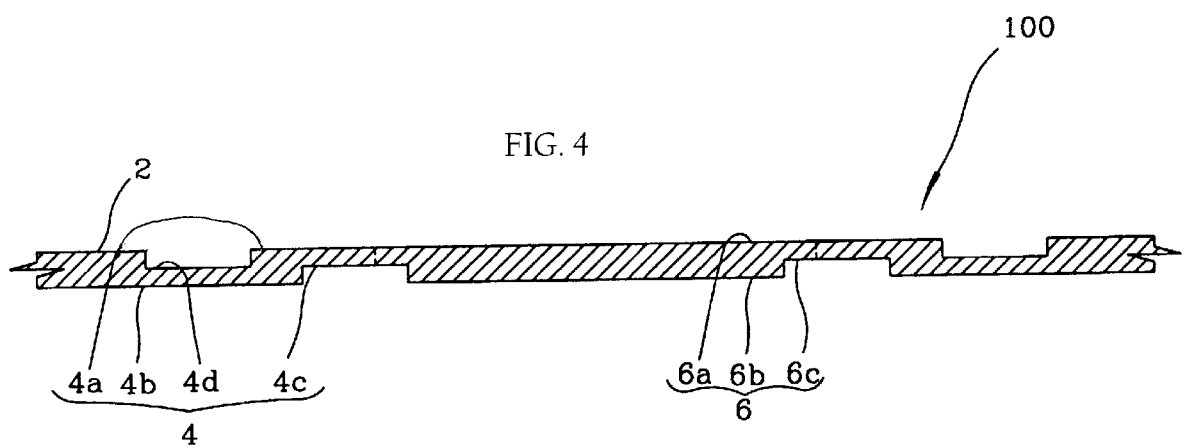
FIG. 4 is a cross-sectional view taken along line II—II of FIG. 1.

Referring now to FIGS. 3 and 4, the lead frame 100 is not fabricated to be of uniform thickness. In this regard, the regions represented as deviant lines in FIGS. 1 and 2 have a thinner thickness than that of the remainder of the frame 2, as will be described in more detail with reference to FIGS. 3 and 4.

As shown in FIGS. 3 and 4, the chip mounting pad 6 defines a substantially flat or planar first surface (upper surface) 6a. In addition to the first surface 6a, the chip mounting pad 6 defines substantially flat or planar second and third surfaces (lower surfaces) 6b, 6c which are opposed to the first surface 6a. The third surface 6c extends along the peripheral edge of the chip mounting pad 6 (i.e., the third surface 6c circumvents the second surface 6b),and is perpendicularly recessed or depressed relative to the second surface 6b. In the lead frame 100, the thickness of the frame 2, tie bars 4, chip mounting pad 6 and leads 8 is approximately 0.15 millimeters to 0.50 millimeters. The distance preferably separating the depressed or recessed third surface 6c from the second surface 6b is approximately 0.075 millimeters to 0.25 millimeters. Stated another way, the depressed depth of the third surface 6c is about 50% or within the range of from about 25% to 75% of the entire thickness of the chip mounting pad 6. However, these relative thicknesses are exemplary only, and can be varied according to the application field.

As seen in FIG. 4, the tie bars 4 which connect the chip mounting pad 6 to the frame 2 also each define a substantially flat or planar first surface (upper surface) 4a, as well as substantially flat or planar second and third surfaces (lower surfaces) 4b, 4c which are opposed to the first surface 4a. The third surface 4c is defined on a portion of the tie bar 4 adjacent the chip mounting pad 6. That is, the third surface 4c is continuous with (i.e., co-planar to) the third surface 6c of the chip mounting pad 6.

In addition to the first, second and third surfaces 4a, 4b, 4c, each of the tie bars 4 defines a substantially flat or planar fourth surface (upper surface) 4d which is formed adjacent the frame 2. As seen in FIG. 4, the fourth surface 4d of each of the tie bars 4 is depressed or recessed from the first surface 4a at a prescribed depth. This prescribed depth is also approximately 0.075 millimeters to 0.25 millimeters, which is about 50% or within the range of about 25% to 75% of the entire thickness of the frame 2, tie bars 4, chip mounting pad 6 and leads 8. Again, this prescribed depth is exemplary only, and can be varied according to the application field.

As shown in FIG. 3, each of the leads 8 defines a substantially flat or planar first surface (upper surface) 8a, and substantially flat or planar second and third surfaces (lower surfaces) 8b, 8c which are opposed to the first surface 8a. The third surface 8c is located at the distal end of the lead 8 closer to the chip mounting pad 6 than the second surface 8b. Additionally, the third surface 8c is depressed or recessed a prescribed depth relative to the second surface 8b. This depth is also approximately 0.075 millimeters to 0.25 millimeters, which is about 50% or within the range of about 25% to 75% of the entire thickness of the frame 2, tie bars 4, chip mounting pad 6 and leads 8. The depressed depth of the third surface 8c relative to the second surface 8b is also exemplary only, and can be varied according to the application field.

As further seen in FIG. 3, each lead 8 further defines a substantially flat or planar fourth surface (upper surface) 8d which is opposed to the second surface 8b and formed adjacent the corresponding dambar 10. The fourth surface 8d of each of the leads 8 is depressed or recessed a prescribed depth relative to the first surface 8a, with such depressed depth also being approximately 0.075 millimeters to 0.25 millimeters which represents about 50% or within the range of about 25% to 75% of the entire thickness of the frame 2, tie bars 4, chip mounting pad 6 and leads 8. Again, this depressed depth is exemplary only, and can be varied according to application field.

The lead frame 100 is preferably manufactured from a metal material, such as copper (Cu), copper alloy (Cu Alloy), alloy 37 (nickel (Ni) of 37%, iron (Fe) of 55%). Additionally, the first surface 8a of each of the leads 8 can be plated with gold (Au), silver (Ag), nickel (Ni), palladium (Pd), or alloys thereof in a predetermined thickness.

In the lead frame 100, a portion of each dambar 10 is singulated to separate the semiconductor package 200 from the frame 2 during a manufacturing step for the semiconductor package 200. That is, the fourth surfaces 4d, 8d formed on the tie bars 4 and the leads 8, respectively, are formed to accommodate the singulation process during the manufacture of the semiconductor package 200.

Figure 5:
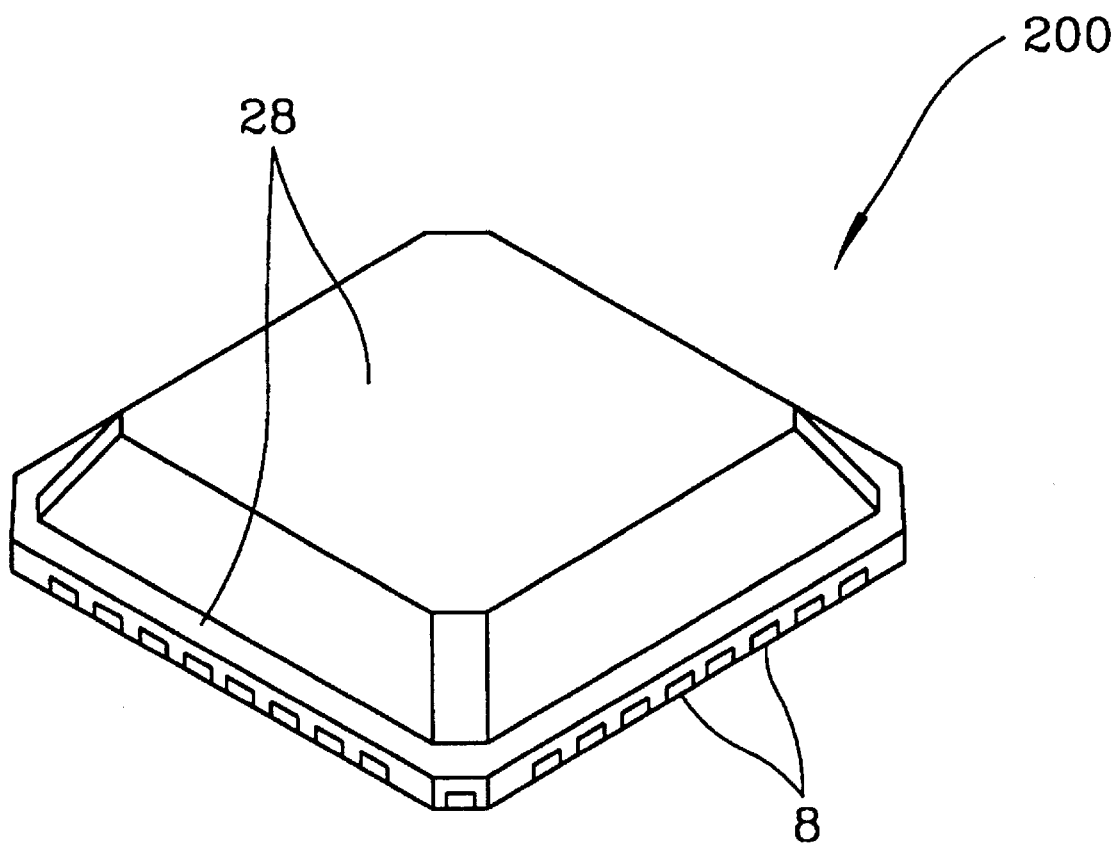
FIG. 5 is a top perspective view of the semiconductor package of the first embodiment.
Figure 6:
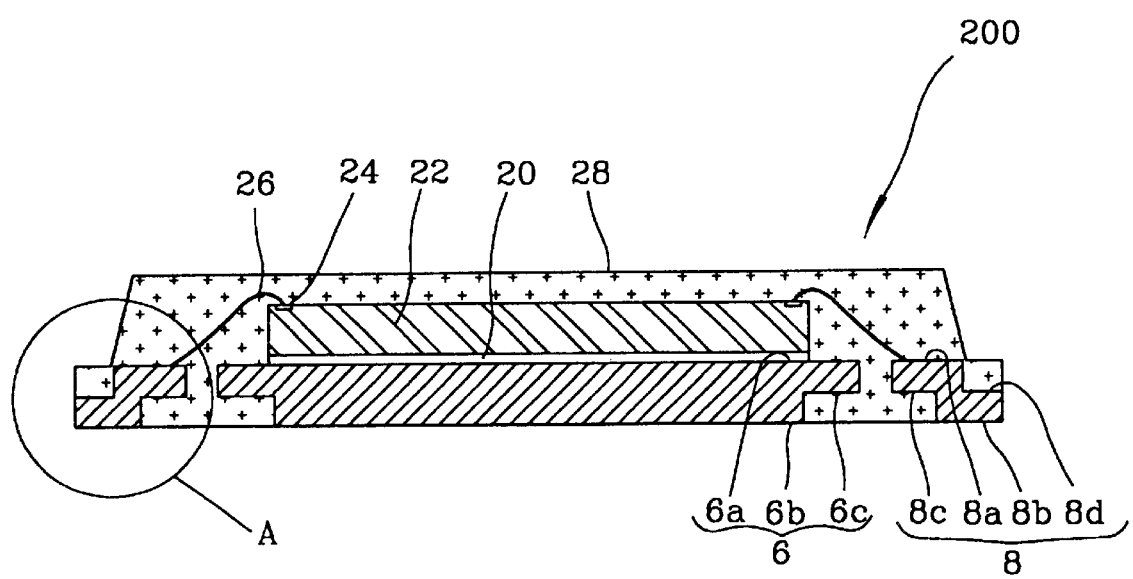
FIG. 6 is a cross-sectional view of the semiconductor package shown in FIG. 5.
Figure 7:
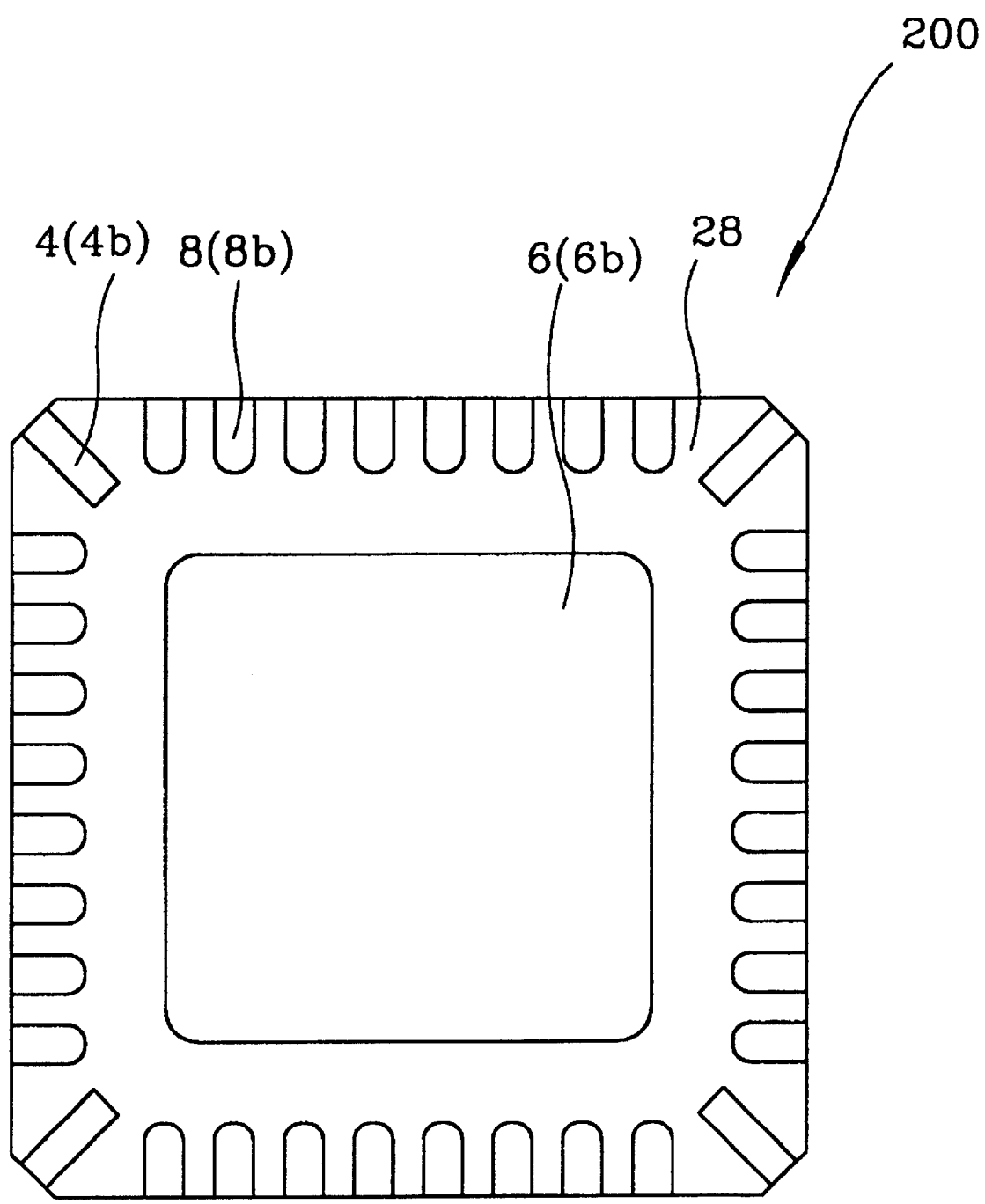
FIG. 7 is a bottom plan view of the semiconductor package shown in FIG. 5.

FIGS. 5–7 provide various views of the semiconductor package 200 of the first embodiment of the present invention. The semiconductor package 200 includes the chip mounting pad 6 of the lead frame 100, as well as portions of the tie bars 4 and leads 8 of the lead frame 100. As seen in FIG. 6, the semiconductor package 200 further includes a semiconductor chip 22 which includes a plurality of input-output pads 24 disposed on an upper surface thereof. The semiconductor chip 22 is bonded to the first surface 6a of the chip mounting pad 6. Such bonding may be accomplished through the use of an epoxy, an adhesive film, or adhesive tape. In the semiconductor package 200, the first surface 8a of each of the leads 8 is mechanically and electrically connected to a respective one of the input-output pads 24 of the semiconductor chip 22. Such connection may be facilitated through the use of conductive wires 26, such as gold, copper, or aluminum wires. Thus, the electrical signals of the semiconductor chip 22 can be transmitted to a motherboard (not shown) via the conductive wires 26 and the leads 8. The conductive wires 26 and the leads 8 may also be used to facilitate the transmission of electrical signals from the motherboard to the semiconductor chip 22. In this regard, the second surfaces 8b, 6b, 4b of the leads 8, chip mounting pad 6, and tie bars 4, respectively, may be electrically connected to the motherboard through the use of solder or its equivalent.

In the semiconductor package 200, the chip mounting pad 6, the semiconductor chip 22, the conductive wire(s) 26, and the leads 8 are sealed with a sealing material, such as an epoxy molding compound. The area sealed with the sealing material is defined as a package body or sealing part 28. More particularly, the sealing part 28 covers the semiconductor chip 22, the conductive wires 26, the first and third surfaces 6a, 6c of the chip mounting pad 6, and the first, third and fourth surfaces 8a, 8c, 8d of each of the singulated leads 8. The second surface 6b of the chip mounting pad 6 and the second surface 8b of each of the leads 8 are exposed and not covered by the sealing part 28. The second surface 4b of each of the tie bars 4 is also not covered and thus exposed when viewing the bottom of the completed semiconductor package 200. Also exposed is the outer side 8f of each of the leads 8.

As also indicated above and as is shown in FIG. 6, the sealing part 28 is formed on and covers the fourth surface 8d of each of the leads 8. That portion of the sealing part 28 formed on the fourth surface 8d of each of the leads 8 is of a predetermined thickness. Thus, in the completed semiconductor package 200, only the second surfaces 8b of the leads 8 and the outermost ends or sides 8f thereof are exposed and thus observable, with the inner ends of the leads 8 and the first, third and fourth surfaces 8a, 8c, 8d thereof being covered by the sealing part 28. The second surfaces 4b, 6b, 8b of the tie bars 4, chip mounting pad 6 and leads 8, respectively, which are exposed within the sealing part 28, may be plated with solder or its equivalent for purposes of facilitating the mounting of the semiconductor package 200 to a motherboard.

Figure 8:
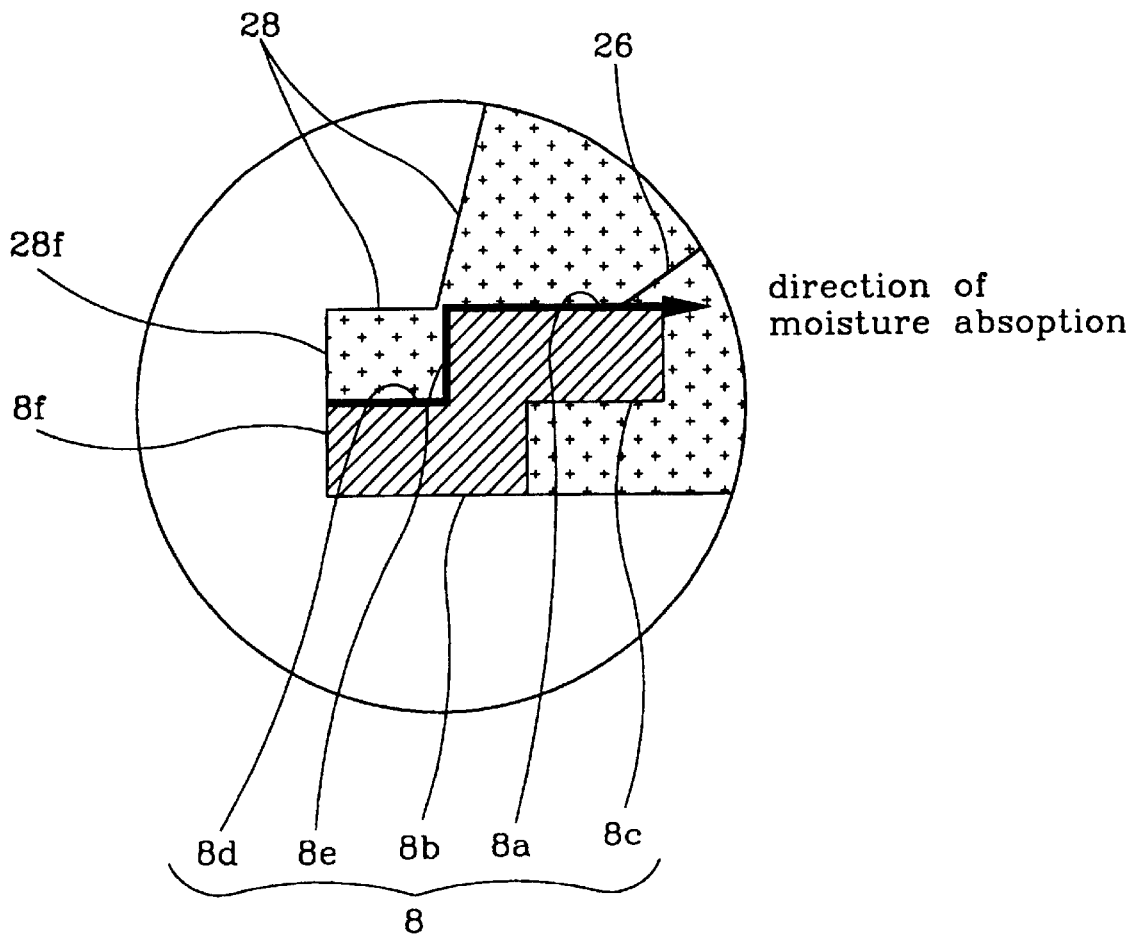
FIG. 8 is an enlargement of the encircled region A shown in FIG. 6.

Referring now to FIG. 8, the upper surface of that portion of the sealing part 28 formed on the fourth surface 8d of each of the leads 8 is located on the same plane (i.e., is substantially co-planar to) the first surface 8a of the lead 8. The sealing part 28 is bonded to the first and fourth surfaces 8a, 8d of each of the leads 8. The sealing part 28 is also bonded to the third surface 8c and a vertical surface 8e defined between the first surface 8a and the fourth surface 8d, thus further increasing the bonding strength between the sealing part 28 and the singulated lead frame 100.

Generally, moisture is absorbed into the inside of the sealing part 28 along the boundary between the sealing part 28 and the leads 8. As the path along the boundary surfaces (i.e., the fourth surface 8d, vertical surface 8e, and first surface 8a) between the sealing part 28 and each lead 8 is increased, the penetration of moisture into the semiconductor package 200 is made more difficult.

The sealing part 28 also defines a side 28f which is formed to be substantially flush or co-planar to the side 8f of each of the leads 8. As indicated above, the side 8f of each of the leads 8 is exposed (i.e., not covered by the sealing part 28). In the semiconductor package 200, that portion of each of the leads 8 defining the fourth surface 8d is formed with a thin profile, with the sealing part 28 being formed on or applied to the fourth surface 8d as indicated above. Since a portion of each lead 8 defining the fourth surface 8d is singulated during the process of manufacturing the semiconductor package 200, the formation of such singulated portion with a thin profile and the application of the sealing part 28 directly thereto minimizes cracking of the semiconductor package 200 during this singulation step.

Figure 9:
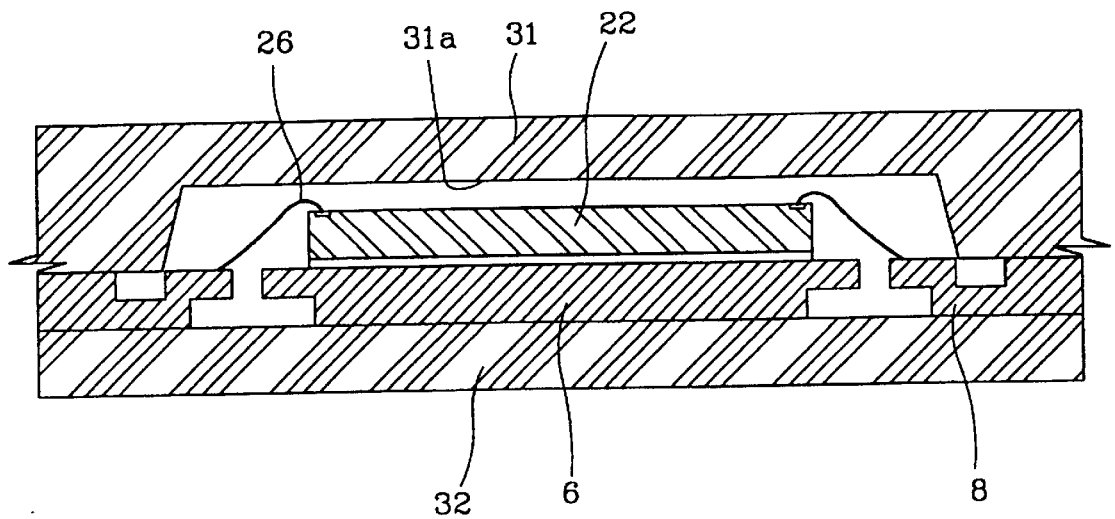
FIG. 9 is a cross-sectional view illustrating a molding process used to facilitate the formation of the sealing part of the semiconductor package shown in FIGS. 5 and 7.

Referring now to FIG. 9, in the process of manufacturing the semiconductor package 200, the formation of the sealing part 28 is accomplished through the use of an upper mold 31 which defines a cavity 31a having a predetermined volume and a substantially flat lower mold 32. Subsequent to the bonding of the semiconductor chip 22 thereto and the completion of the wire bonding step described above, the lead frame 100 is loaded onto the lower mold 32. Thereafter, the upper mold 31 defining the cavity 31a is coupled to the lower mold 32. A sealing material is then injected into the cavity 31a at a high temperature under a high pressure to form the sealing part 28. The cavity 31a of the upper mold 31 communicates with the fourth surface 8d of each of the leads 8 so that a sufficient amount of the sealing material is injected onto the fourth surfaces 8d to facilitate the complete formation of the sealing part 28. Since the second surface 6b of the chip mounting pad 6, the second surface 4b of each of the tie bars 4, and the second surface 8b of each of the leads 8 directly contact the lower mold 32, such second surfaces 6b, 4b, 8b remain exposed in the completely formed semiconductor package 200 as indicated above.

Figure 10:
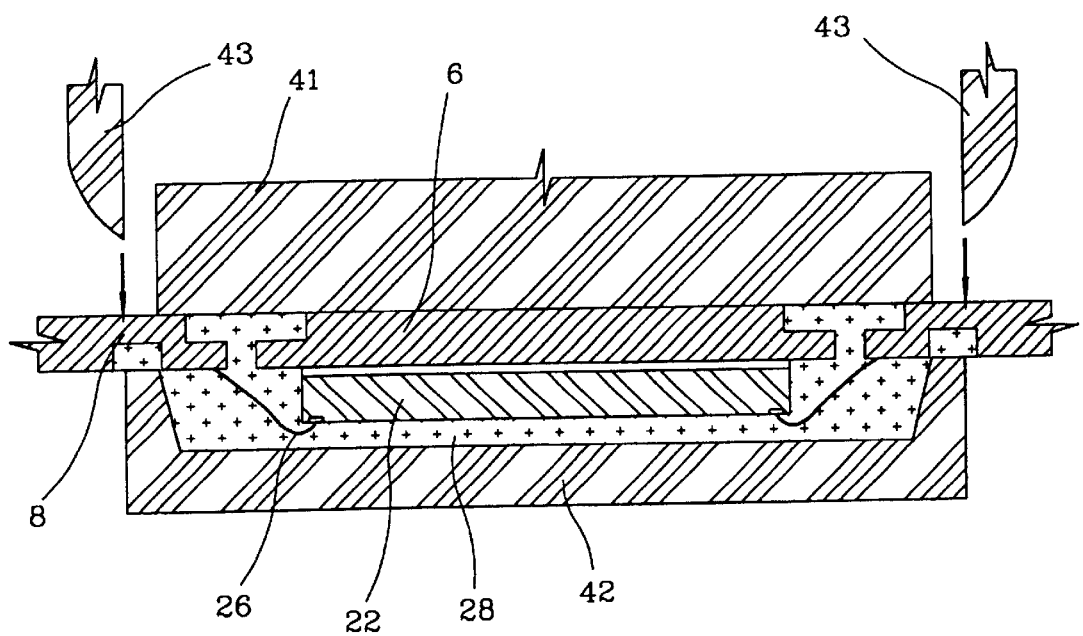
FIG. 10 is a cross-sectional view illustrating a singulation step used to facilitate the formation of the semiconductor package shown in FIGS. 5 and 7.

Referring now to FIG. 10, singulation is performed upon the completion of the sealing and plating processes. The singulation is performed with the semiconductor package 200 being "inverted". The singulation step is carried out using a singulation device which includes a lower tool 42 adapted to receive the sealing part 28, an upper tool 41 adapted to fix the semiconductor package 200 by clamping the same to the lower tool 42, and a punch 43 which singulates a prescribed region of the semiconductor package 200. More particularly, the punch 43 is adapted to hit or strike the second surfaces 8b of the leads 8, the fourth surfaces 8d of the leads 8, and that portion of the sealing part 28 formed on the fourth surfaces 8d. The punch also hits or strikes the second surfaces 4b of the tie bars 4, the fourth surfaces 4d of the tie bars 4, and those portions of the sealing part 28 formed on the fourth surfaces 4d. The impact of the punch 43 is absorbed into the leads 8 and the sealing part 28 formed on the fourth surfaces 8d, 4d, thus minimizing cracking of the semiconductor package 200 periphery during the singulation step. Those portions of the sealing part 28 formed between the leads 8 or between the leads 8 and the tie bars 4 also absorb the impact of the punch 43 during the singulation step.

If the fourth surfaces 8d, 4d were not defined by the leads 8 and tie bars 4, respectively, the first surfaces 8a of the leads 8 and first surfaces 4a of the tie bars 4 would be exposed within the sealing part 28, with the plating layers thus being formed on the exposed first surfaces 8a, 4a during the plating step. As such, the plating layer formed on the first surfaces 8a, 4a would not be disposed in generally co-planar relation to the surrounding surfaces of the sealing part 28, but rather would project outwardly relative to the sealing part 28. Thus, the impact of the punch 43 would be concentrated on the plating layers during the singulation step, thus substantially increasing the probability of a crack being formed in the semiconductor package periphery 200. In this regard, since the sealing part 28 between the leads 8 and tie bars 4 would not be in direct contact with the lower tool 42, all of the impact force of the punch 43 would be transmitted to the leads 8. Thus, cracking of the semiconductor package periphery 200 could easily occur.

Figure 11:
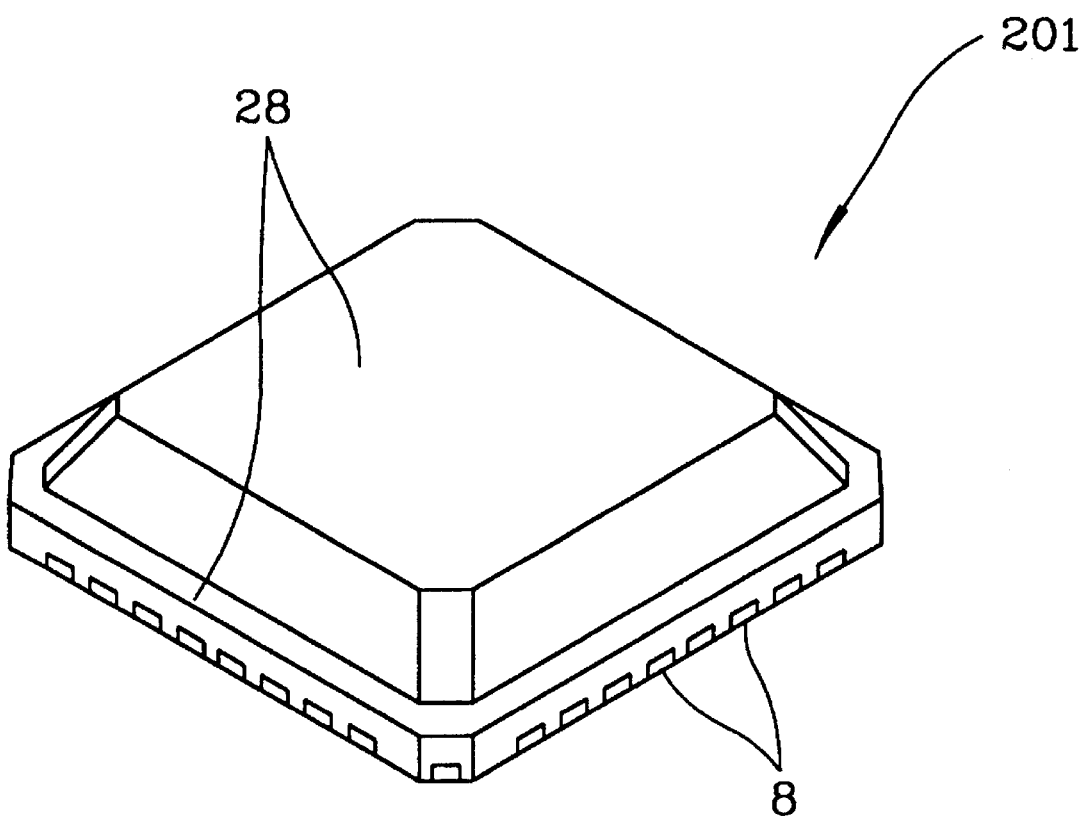
FIG. 11 is a top perspective view of a semiconductor package constructed in accordance with a second embodiment of the present invention.
Figure 12:
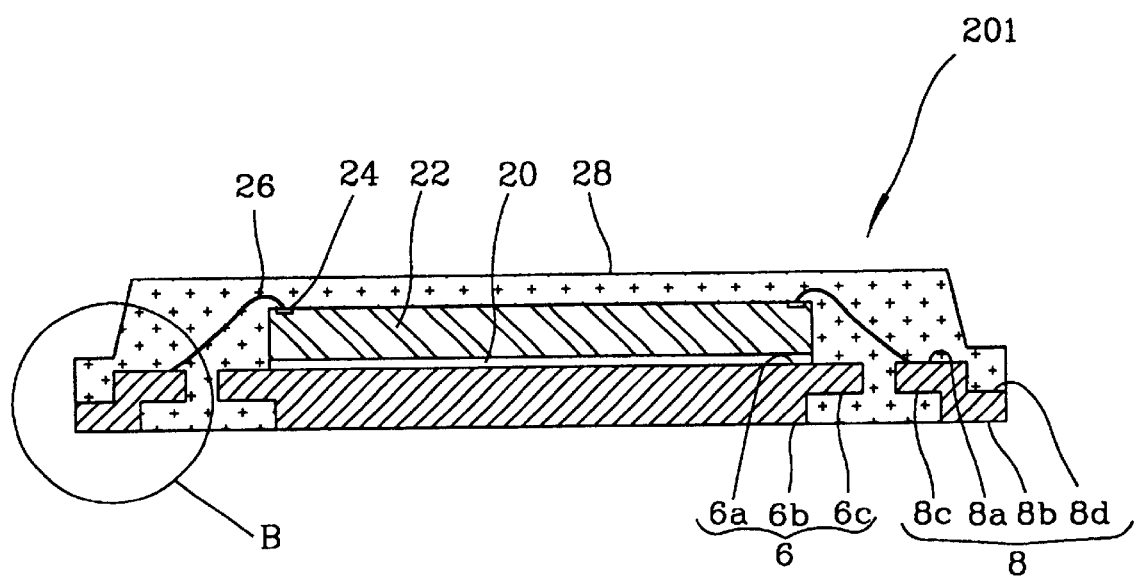
FIG. 12 is a cross-sectional view of the semiconductor package shown in FIG. 11.
Figure 13:
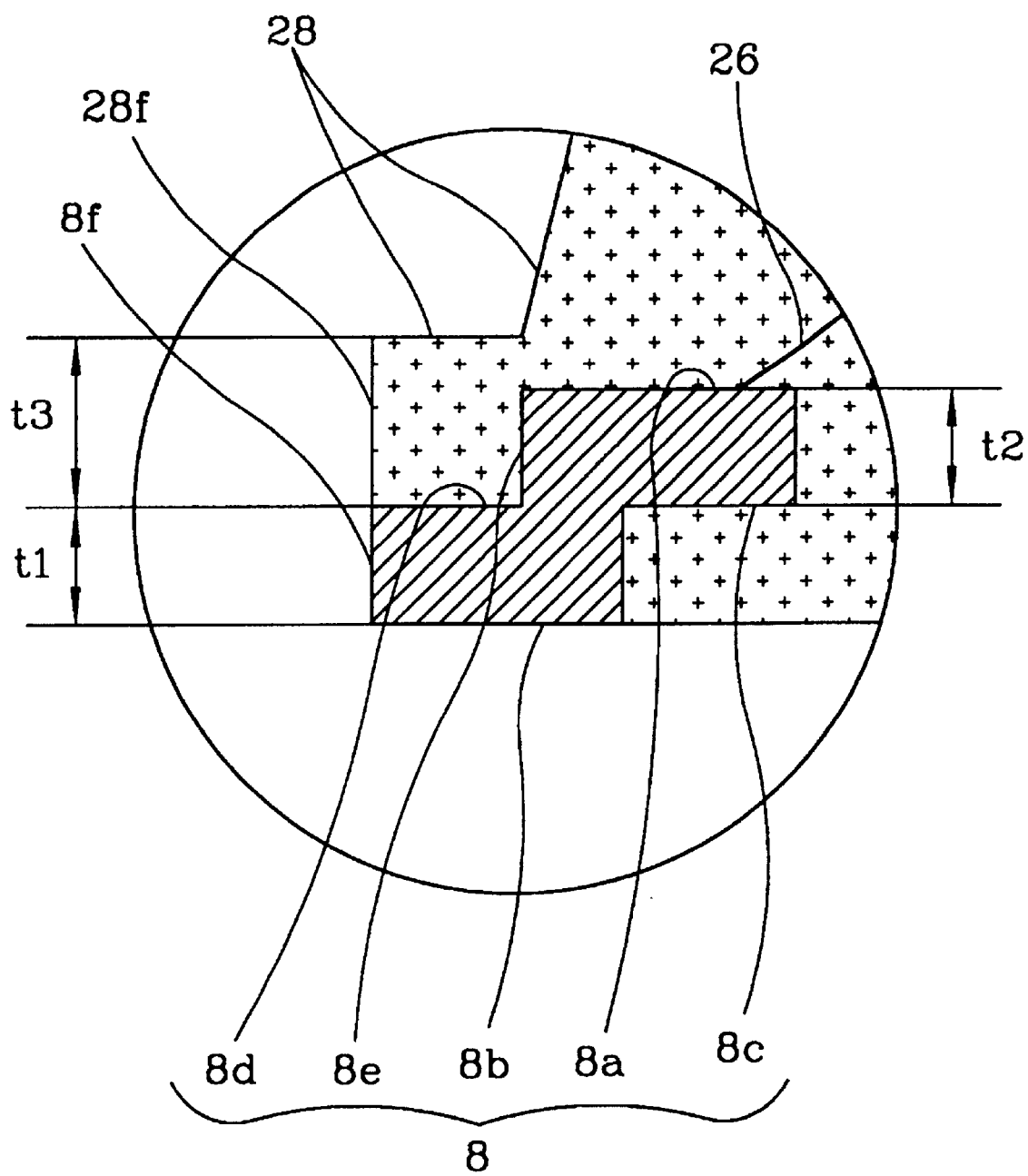
FIG. 13 is an enlargement of the encircled region B shown in FIG. 12.

Referring now to FIG. 11, there is shown a semiconductor package 201 constructed in accordance with a second embodiment of the present invention. The primary distinction between the semiconductor package 201 and the aforementioned semiconductor package 200 lies in the increased thickness of the sealing part 28 formed on the fourth surfaces 8d of the leads 8 in the semiconductor package 201. As seen in FIG. 13, each lead 8 has a thickness t1 from the second surface 8b to the fourth surface 8d, and a thickness t2 from the first surface 8a to the third surface 8c. The thickness from the fourth surface 8d of each lead 8 to the upper surface of the sealing part 28 is defined as t3. The thickness t3 exceeds the thickness t2 and the thickness t1. In this regard, the criticality is that the thickness t3 be selected such that the upper surface of the sealing part 28 formed on the fourth surface 8d of each of the leads 8 is positioned or disposed at a level which is higher than that of the first surface 8a of each of the leads 8. As indicated above, the primary structural distinction between the semiconductor package 201 and the semiconductor package 200 is that the upper surface of the sealing part 28 in the semiconductor package 200 is substantially co-planar with the first surfaces 8a of the leads 8 as opposed to being elevated thereabove, as is the case in the semiconductor package 201.

When the thickness t3 of the sealing part 28 exceeds the thickness t2 (i.e., the upper surface of the sealing part 28 is positioned at a higher level than that of the first surfaces 8a of the leads 8 as described above), the sealing part 28 is easily formed during the sealing process and the absorption of the impact is maximized during the singulation process. That is, during the sealing process, the space between the cavity 31a of the upper mold 31 and the first and fourth surfaces 8a, 8d of each of the leads 8 is larger, so that the sealing part 28 can easily be formed on the fourth surface 8d of each of the leads 8, and the impact of the punch 43 can be absorbed optimally, attributable to the thicker sealing part 28. The semiconductor package 201 also possesses the attributes of improved bonding strength and the prevention of moisture permeation and cracking, as described above in relation to the semiconductor package 200 of the first embodiment.

Figure 14:
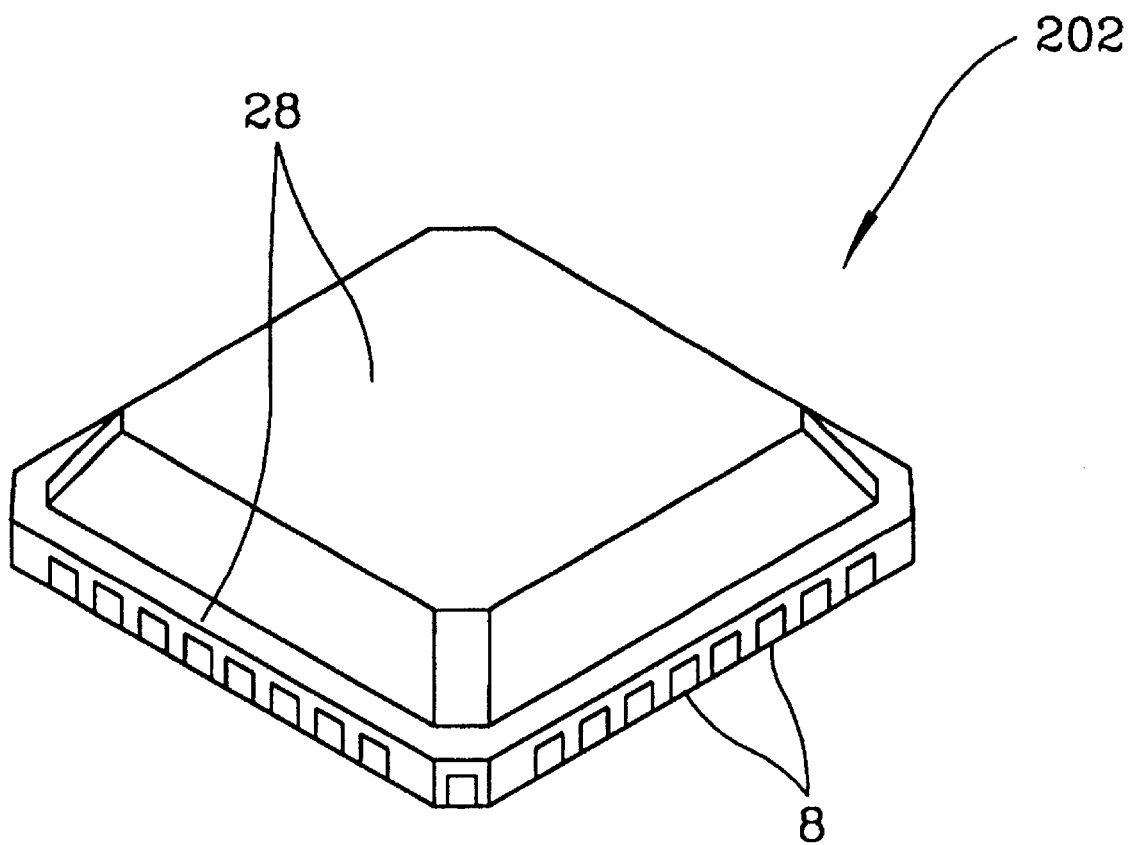
FIG. 14 is a top perspective view of a semiconductor package constructed in accordance with a third embodiment of the present invention.
Figure 15:
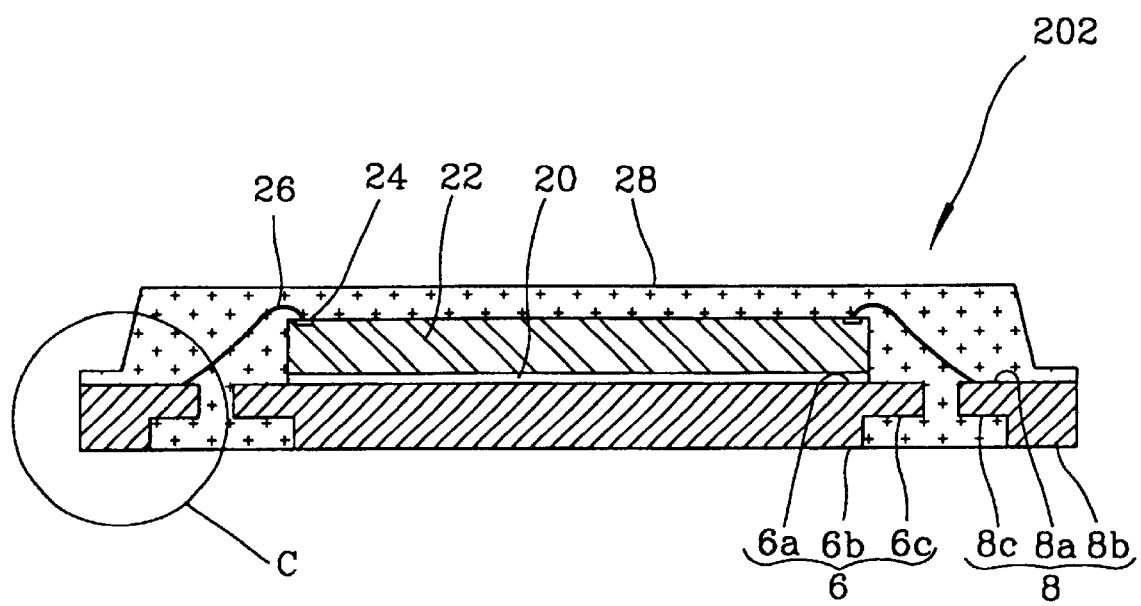
FIG. 15 is a cross-sectional view of the semiconductor package shown in FIG. 14.
Figure 16:
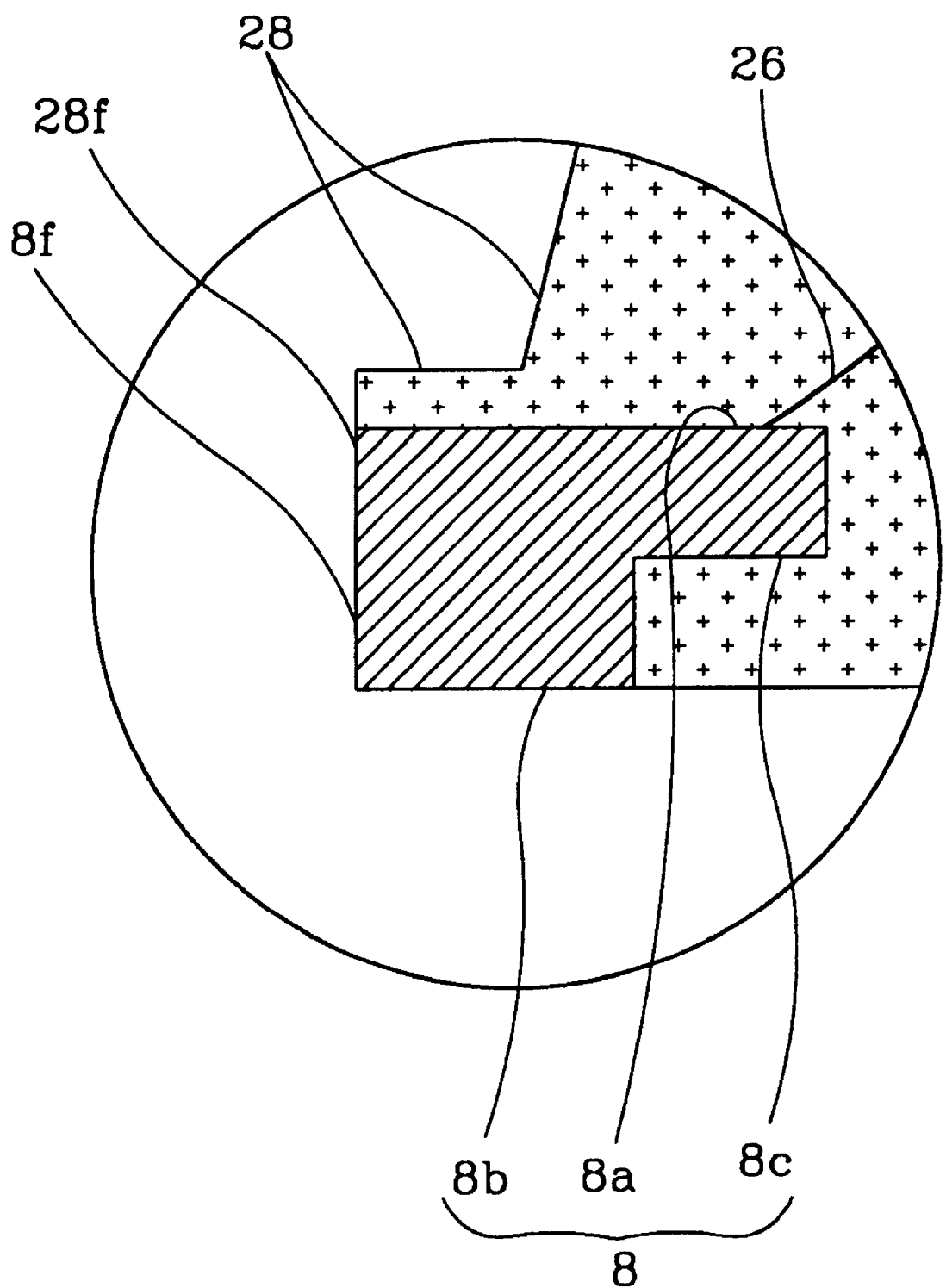
FIG. 16 is an enlargement of the encircled region C shown in FIG. 15.

Referring now to FIGS. 14–16, there is shown a semiconductor package 202 constructed in accordance with a third embodiment of the present invention. The semiconductor package 202 of the third embodiment is similar in structure to the semiconductor package 201 of the second embodiment, except that the leads 8 of the semiconductor package 202 are not formed to include the fourth surfaces 8d. As such, the first surface 8a of each of the leads 8 extends in an uninterrupted fashion from the innermost end to the outermost end of each lead 8. In the semiconductor package 202, the sealing part 28 is formed on and completely covers the first surfaces 8a of the leads 8. Thus, only the second surfaces 8b and the sides 8f of the leads 8 are exposed on the outside of the sealing part 28. As described above, the second surface 6b of the chip mounting pad 6 is also exposed within the sealing part 28, with the side 28f of the sealing part 28 being substantially flush or co-planar to the side 8f of each of the leads 8.

Thus, in the semiconductor package 202 of the third embodiment, the sealing part 28 formed on the first surface 8a of each of the leads 8 is in direct contact with the lower tool 42 during the singulation process, thus allowing the sealing part 28 to absorb the impact of the punch 43. This attribute also substantially prevents occurrences of cracking in the semiconductor package periphery 202 during the manufacture thereof.

As discussed above, in each of the embodiments of the semiconductor package 200, 201, 202, the contact area between the sealing part 28 and the singulated portions of the lead frame 100 is increased, thus having the effect of improving the bonding strength between the lead frame 100 and the sealing part 28. This increased contact area between the sealing part 28 and the lead frame 100 also maximizes the passage length for potential moisture permeation, thereby minimizing such moisture permeation potential. Further, in the semiconductor packages 200, 201, the thinner profile of those portions of the leads 8 which are singulated also has the effect of providing maximum crack prevention during the singulation process.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a chip mounting pad;
    a semiconductor chip attached to the chip mounting pad;
    a plurality of leads extending at least partially about the chip mounting pad in spaced relation thereto, each of the leads defining:
        a generally planar first lead surface;
        a generally planar second lead surface disposed in opposed relation to the first lead surface; and
        a generally planar third lead surface disposed in opposed relation to the first lead surface and oriented closer to the chip mounting pad than the second lead surface;
    each of the leads having a first lead thickness between the first and second lead surfaces which exceeds a second lead thickness between the first and third lead surfaces
    at least one conductive wire electrically connected to and extending between the semiconductor chip and a respective one of the first lead surfaces of the leads; and
    a sealing part defining a top surface, a bottom surface disposed in opposed relation to the top surface, and an upper shoulder surface disposed in opposed relation to the bottom surface and recessed relative to the top surface, the sealing part partially encapsulating the chip mounting pad, the leads, the semiconductor chip and the conductive wire such that the second lead surface of each of the leads is exposed in the bottom surface and the first lead surface of each of the leads is completely covered by the sealing part.

2. The semiconductor package of claim 1 wherein the chip mounting pad defines:
    a generally planar first pad surface;
    a generally planar second pad surface disposed in opposed relation to the first pad surface; and
    a generally planar third pad surface disposed in opposed relation to the first pad surface and circumventing the second pad surface;
    the chip mounting pad having a first pad thickness between the first and second pad surfaces which exceeds a second pad thickness between the first and third pad surfaces;
    the semiconductor chip being attached to the first pad surface, with the sealing part partially encapsulating the chip mounting pad such that the second pad surface is exposed in the bottom surface of the sealing part.

3. The semiconductor package of claim 2 wherein the semiconductor chip is bonded to the first pad surface of the chip mounting pad.

4. The semiconductor package of claim 1 wherein the sealing part is formed to the of a predetermined thickness upon the first lead surface of each of the leads.

5. The semiconductor package of claim 1 wherein the sealing part is formed on the first lead surface of each of the leads such that the upper shoulder surface and the first lead surface of each of the leads extend along respective, generally parallel planes.

6. The semiconductor package of claim 1 wherein
    each of the leads further defines a generally planar fourth lead surface disposed in opposed relation to the second lead surface and oriented further from the chip mounting pad than the first and third lead surfaces; and
    each of the leads has a third lead thickness between the second and fourth lead surfaces which is less than the first lead thickness.

7. The semiconductor package of claim 6 wherein the sealing part is formed to be of a predetermined thickness upon the fourth lead surface of each of the leads.

8. The semiconductor package of claim 6 wherein the sealing part is formed on the fourth lead surface of each of the leads such that the upper shoulder surface extends in substantially co-planar relation to the first lead surface of each of the leads.

9. The semiconductor package of claim 6 wherein the sealing part is formed on the fourth lead surface of each of the leads such that the upper shoulder surface and the first lead surface of each of the leads extend along respective, generally parallel planes.

10. The semiconductor package of claim 1 wherein:
    each of the leads defines an outer end which extends generally perpendicularly between the first and second lead surfaces thereof;
    the sealing part defines a peripheral outer side which extends generally perpendicularly between the bottom and upper shoulder surfaces thereof; and
    the outer end of each of the leads is substantially flush with the outer side of the sealing part.

11. A semiconductor package comprising:
    a chip mounting pad;
    a plurality of leads extending at least partially about the chip mounting pad in spaced relation thereto, each of the leads defining:
        a generally planar first lead surface;
        a generally planar second lead surface disposed in opposed relation to the first lead surface; and
        a generally planar third lead surface disposed in opposed relation to the first lead surface and oriented closer to the chip mounting pad than the second lead surface;
    each of the leads having a first lead thickness between the first and second lead surfaces which exceeds a second lead thickness between the first and third lead surfaces;
    a semiconductor chip attached to the chip mounting pad and electrically connected to at least one of the leads; and
    a sealing part defining a top surface, a bottom surface disposed in opposed relation to the top surface, and an upper shoulder surface disposed in opposed relation to the bottom surface and recessed relative to the top surface, the sealing part partially encapsulating the chip mounting pad, the leads, and the semiconductor chip such that the second lead surface of each of the leads is exposed in the bottom surface and the first lead surface of each of the leads is completely covered by the sealing part.

12. The semiconductor package of claim 11 wherein the chip mounting pad defines:

a generally planar first pad surface;

a generally planar second pad surface disposed in opposed relation to the first pad surface; and a generally planar third pad surface disposed in opposed relation to the first pad surface and circumventing the second pad surface;

the chip mounting pad having a first pad thickness between the first and second pad surfaces which exceeds a second pad thickness between the first and third pad surfaces;

the semiconductor chip being attached to the first pad surface.

13. The semiconductor package of claim 12 wherein the sealing part partially encapsulates the chip mounting pad such that the second pad surface is exposed in the bottom surface of the sealing part.

14. The semiconductor package of claim 12 wherein the semiconductor chip is bonded to the first pad surface of the chip mounting pad.

15. The semiconductor package of claim 11 wherein the sealing part is formed to be of a predetermined thickness upon the first lead surface of each of the leads.

16. The semiconductor package of claim 11 wherein the sealing part is formed on the first lead surface of each of the leads such that the upper shoulder surface and the first lead surface of each of the leads extend along respective, generally parallel planes.

* * * * *